US012412635B2

(12) United States Patent
Wu et al.

(10) Patent No.: US 12,412,635 B2
(45) Date of Patent: Sep. 9, 2025

(54) APPARATUS AND METHOD FOR PERFORMING SELF-CALIBRATION OF RECEIVER OFFSET WITHOUT SHORTING DIFFERENTIAL INPUT TERMINALS OF RECEIVER

(71) Applicant: Faraday Technology Corp., Hsin-Chu (TW)

(72) Inventors: Chih-Hung Wu, Hsin-Chu (TW); Ko-Ching Chao, Hsin-Chu (TW); Po-Wen Hsiao, Hsin-Chu (TW); Zhou-Lun Liou, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 143 days.

(21) Appl. No.: 18/540,879

(22) Filed: Dec. 15, 2023

(65) Prior Publication Data

US 2024/0304268 A1    Sep. 12, 2024

(30) Foreign Application Priority Data

Mar. 7, 2023   (TW) ................................. 112108321

(51) Int. Cl.
  *G11C 29/02*   (2006.01)
  *G11C 7/14*   (2006.01)
  *G11C 8/18*   (2006.01)
(52) U.S. Cl.
  CPC .............. *G11C 29/028* (2013.01); *G11C 7/14* (2013.01); *G11C 8/18* (2013.01)

(58) Field of Classification Search
  CPC .............................. G11C 29/028; G11C 29/02
  USPC ......................................................... 365/191
  See application file for complete search history.

(56) References Cited

U.S. PATENT DOCUMENTS

| | | | |
|---|---|---|---|
| 7,362,800 B1* | 4/2008 | Zerbe | H04L 25/03038 375/232 |
| 9,711,189 B1* | 7/2017 | Wang | G11C 29/028 |
| 12,014,767 B2* | 6/2024 | Gopalan | G11C 29/022 |
| 2001/0047450 A1* | 11/2001 | Gillingham | G11C 8/18 713/400 |
| 2005/0119849 A1 | 6/2005 | Jeddeloh | |

(Continued)

FOREIGN PATENT DOCUMENTS

CN   113728385 A   11/2021

*Primary Examiner* — Muna A Techane
(74) *Attorney, Agent, or Firm* — Winston Hsu

(57) ABSTRACT

A method and apparatus for performing self-calibration of receiver offset without shorting differential input terminals of a receiver are provided. The self-calibration includes: inputting input signals carrying predetermined data patterns into a plurality of receivers; performing data eye width measurement on the input signals received by the plurality of receivers to obtain multiple first data eye widths and multiple second data eye widths respectively corresponding to first and second data bytes; performing first offset calibration to make the multiple first data eye widths converge to a first common data eye width; performing second offset calibration to make the multiple second data eye widths be equal to the multiple first data eye widths, respectively, and converge to the first common data eye width; and performing reference voltage calibration on a reference voltage to optimize the multiple first data eye widths and the multiple second data eye widths.

14 Claims, 10 Drawing Sheets

(56) References Cited

U.S. PATENT DOCUMENTS

2017/0213585 A1     7/2017   Schoenborn
2021/0082149 A1*   3/2021   Sheorey .................... G06T 7/85

* cited by examiner

APPARATUS AND METHOD FOR PERFORMING SELF-CALIBRATION OF RECEIVER OFFSET WITHOUT SHORTING DIFFERENTIAL INPUT TERMINALS OF RECEIVER

BACKGROUND OF THE INVENTION

1. Field of the Invention

The present invention is related to memory control, and more particularly, to a method for performing self-calibration of receiver offset without shorting differential input terminals of a receiver. The present invention is also related to an associated apparatus, such as a memory interface circuit, a memory subsystem including the memory interface circuit, and an electronic device including the memory subsystem.

2. Description of the Prior Art

An electronic device (e.g. a desktop computer, a laptop computer, or a mobile phone) may be equipped with at least one dynamic random memory (DRAM) such as a double data rate (DDR) synchronous DRAM (SDRAM), for temporarily storing information to increase overall performance.

In a conventional memory interface circuit, a receiver offset is required to be adjusted to ensure the received data is correct. In order to perform the adjustment operation, a first additional switch must be implemented for temporarily shorting a set of differential input terminals of a receiver. A second additional switch must be implemented for temporarily disconnecting a signal path between an input and output terminal and an input terminal of the set of differential input terminals. The number of additional switches will be increased along with the number of receivers. These additional switches make the circuit architecture more complex. In addition, these additional switches are typically not ideal due to limitations of their component characteristics. In order to reduce a non-ideal side effect such as a bandwidth of the signal path being narrowed, the design of the second additional switch may need to be modified, which may make it harder to suppress another side effect such as a leakage path provided by the second additional switch making the adjustment operation less accurate.

Thus, a novel method and associated architecture are needed for solving the above problems without introducing any side effect or in a way that is less likely to introduce a side effect.

SUMMARY OF THE INVENTION

It is therefore one of the objectives of the present invention to provide a method for performing self-calibration of receiver offset without shorting differential input terminals of a receiver. It is another objective of the present invention to provide an associated apparatus such as a memory interface circuit, a memory subsystem including the memory interface circuit, and an electronic device including the memory subsystem, to address the above-mentioned issues.

According to at least one embodiment of the present invention, an apparatus for performing self-calibration of receiver offset without shorting differential input terminals of a receiver is provided. The apparatus comprises a memory interface circuit. The memory interface circuit is arranged to control a DDR SDRAM, wherein a plurality of modes of the memory interface circuit comprises a general mode and a calibration mode. In addition, the memory interface circuit comprises a controller, a transmitting circuit, a receiving circuit, and a training control circuit, wherein each of the transmitting circuit, the receiving circuit, and the training control circuit is coupled to the controller. The controller is arranged to control operations of the memory interface circuit. The transmitting circuit is arranged to transmit data to the DDR SDRAM in the general mode. The receiving circuit is arranged to receive data from the DDR SDRAM in the general mode, wherein the receiving circuit comprises a plurality of receivers, and the receiver represents any of the plurality of the receivers. The training control circuit is arranged to control the memory interface circuit to perform the self-calibration in the calibration mode. In addition, the self-calibration comprises: inputting a set of first input signals carrying at least one first predetermined data pattern to multiple first receivers in the plurality of receivers; performing data eye width measurement upon the set of first input signals received by the multiple first receivers according to at least one data strobe signal to obtain multiple first data eye widths corresponding to a first data byte; performing first offset calibration upon the multiple first receivers to make the multiple first data eye widths converge to a first common data eye width, wherein the first offset calibration comprises adjusting respective offset control codes of the multiple first receivers; inputting a set of second input signals carrying at least one second predetermined data pattern to multiple second receivers in the plurality of receivers; performing the data eye width measurement upon the set of second input signals received by the multiple second receivers according to the at least one data strobe signal to obtain multiple second data eye widths corresponding to a second data byte; performing second offset calibration upon the multiple second receivers to make the multiple second data eye widths be equal to the multiple first data eye widths, respectively, so that the second data eye widths converge to the first common data eye width, wherein the second offset calibration comprises adjusting respective offset control codes of the multiple second receivers; and performing reference voltage calibration upon a reference voltage of the plurality of receivers to optimize the multiple first data eye widths and the multiple second data eye widths.

According to some embodiments, the apparatus comprises at least one portion (e.g. a portion or all) of an electronic device. For example, the apparatus may include a memory subsystem in the electronic device, and the memory subsystem comprises: a memory controller for controlling the memory subsystem; the memory interface circuit; and the DDR SDRAM. In another example, the apparatus may comprise the electronic device, and the electronic device may comprise: a host for controlling the electronic device; and the memory subsystem.

According to at least one embodiment of the present invention, a method for performing self-calibration of receiver offset without shorting differential input terminals of a receiver is provided, wherein the method is applicable to a memory interface circuit, and the memory interface circuit is arranged to control a DDR SDRAM. The method comprises: utilizing a training control circuit to control the memory interface circuit to perform the self-calibration in a calibration mode, wherein a plurality of modes of the memory interface circuit comprise a general mode and the calibration mode. The memory interface circuit comprises: a transmitting circuit, a receiving circuit, and the training control circuit, wherein the transmitting circuit is arranged to transmit data to the DDR SDRAM in the general mode, the receiving circuit is arranged to receive data from the DDR SDRAM in the general mode, and the receiver represents any of the plurality of receivers. In addition, the self-calibration comprises: inputting a set of first input signals carrying at least one first predetermined data pattern to multiple first receivers in the plurality of receivers; performing data eye width measurement upon the set of first input signals received by the multiple first receivers according to at least one data strobe signal to obtain multiple first data eye widths corresponding to a first data byte; performing first offset calibration upon the multiple first receivers to make the multiple first data eye widths converge to a first common data eye width, wherein the first offset calibration comprises adjusting respective offset control codes of the multiple first receivers; inputting a set of second input signals carrying at least one second predetermined data pattern to multiple second receivers in the plurality of receivers; performing the data eye width measurement upon the set of second input signals received by the multiple second receivers according to the at least one data strobe signal to obtain multiple second data eye widths corresponding to a second data byte; performing second offset calibration upon the multiple second receivers to make the multiple second data eye widths be equal to the multiple first data eye widths, respectively, so that the second data eye widths converge to the first common data eye width, wherein the second offset calibration comprises adjusting respective offset control codes of the multiple second receivers; and performing reference voltage calibration upon a reference voltage of the plurality of receivers to optimize the multiple first data eye widths and the multiple second data eye widths.

One of the benefits of the present invention is that respective offsets of the receivers can be precisely corrected without complex circuit architecture. Compared with the related art, the present invention method and apparatus can implement an electronic device with reliable memory control without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
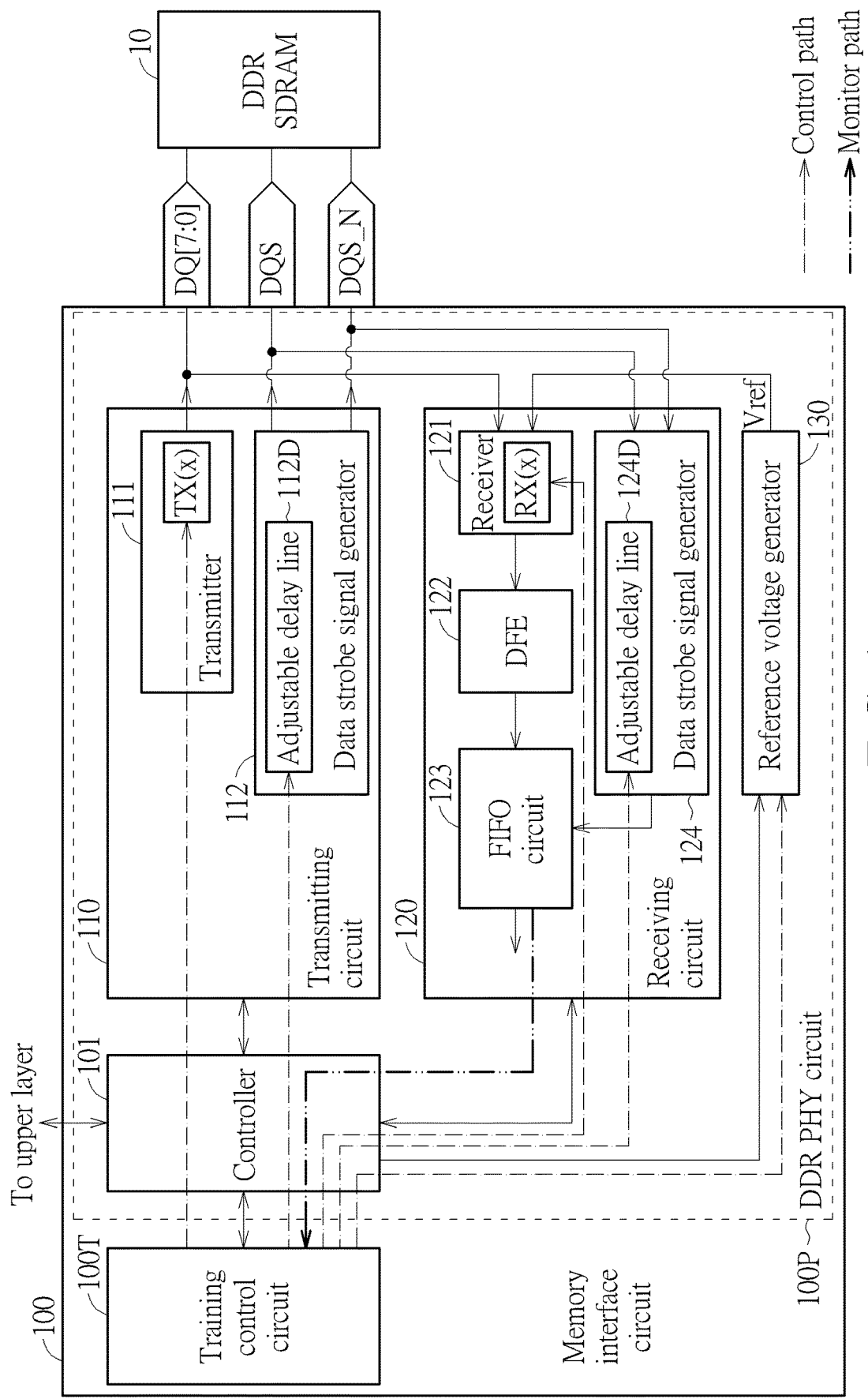
FIG. 1 is a diagram illustrating an apparatus for performing self-calibration of receiver offset without shorting differential input terminals of a receiver according to an embodiment of the present invention.

FIG. 1 is a diagram illustrating an apparatus for performing self-calibration of receiver offset without shorting differential input terminals of a receiver according to an embodiment of the present invention, wherein the apparatus includes a double data rate (DDR) synchronous DRAM (SDRAM) 10 and a memory interface circuit 100 for controlling the DDR SDRAM 10. The memory interface circuit 100 includes a DDR physical layer (PHY) circuit 100P and a training control circuit 100T coupled to the DDR PHY circuit 100P. The DDR PHY circuit 100P includes a controller 101, a transmitting circuit 110, a receiving circuit 120, and a reference voltage generator 130, wherein each of the transmitting circuit 110, the receiving circuit 120, and the reference voltage generator 130 is coupled to the controller 101, but the present invention is not limited thereto. In some embodiments, architecture of the memory interface circuit 100 may vary. For example, the training control circuit 100T may be integrated into the DDR PHY circuit 100P, wherein the memory interface circuit 100 may represent the DDR PHY circuit 100P.

As shown in FIG. 1, the transmitting circuit 110 includes a plurality of transmitters 111 (e.g. transmitters {TX(x)}, such as transmitters {TX(1), TX(2), ... }) and a data strobe signal generator 112, wherein the data strobe signal generator 112 includes an adjustable delay line 112D. In addition, the receiving circuit 120 includes a plurality of receivers 121 (e.g. receivers {RX(x)}, such as receivers {RX(1), RX(2), ... }), a decision feedback equalizer (DFE) 122, a first in first out (FIFO) circuit 123, and a data strobe signal converter 124. The data strobe signal converter 124 includes an adjustable delay line 124D, and the receiver may represent any receiver RX(x) in the receivers 121 (e.g. the receivers {RX(x)}). A reference voltage Vref is generated by the reference voltage generator 130, and is input to the receivers 121 (e.g. the receivers {RX(x)} as a reference for data receiving.

A plurality of modes of the memory interface circuit 100 may include a general mode (or a normal mode) and a calibration mode. For example, in the general mode, the controller 101 may control operations of the memory interface circuit 100 in response to control information of at least one upper layer module (e.g. a host and a memory controller that are not shown in FIG. 1), the transmitting circuit 110 may transmit data to the DDR SDRAM 10, and the receiving circuit 120 may receive data from the DDR SDRAM 10. As a result, the memory interface circuit 100 may write data into the DDR SDRAM 10 or read data from the DDR SDRAM 10 for the at least one upper layer module in the general mode. During the process of writing data into the DDR SDRAM 10, the memory interface circuit 100 may utilize the transmitters 111 (e.g. the transmitters {TX(x)}) to transmit data to the DDR SDRAM 10 by data signals DQ[7:0], and utilize the data strobe signal generator 112 to generate data strobe signals DQS and DGS_N, in order to allow the DDR SDRAM 10 to correctly receive the data by referring to the data strobe signals DQS and DQS_N. During the process of reading data from the DDR SDRAM 10, the memory interface circuit 100 may utilize the receivers 121 (e.g. the receivers {RX(x)}) to receive data from the DDR SDRAM 10 by the data signals DQ[7:0], utilize the DFE 122 to perform a decision feedback equalization operation upon the data, utilize the data strobe signal converter 124 to convert the data strobe signals DQS and DQS_N generated by the DDR SDRAM 10 into a corresponding data strobe signal for reading the data, and utilize the FIFO circuit 123 to refer to a corresponding data strobe signal for capturing the data as at least a portion of output data of the receiving circuit 120.

In the calibration mode, the training control circuit 100T may control the memory interface circuit 100 to perform the self-calibration. For example, the training control circuit 100T may control respective control parameters of the transmitter 111 (e.g. the transmitters {TX(X)}), the receivers 121 (e.g. the receivers RX{x}), the adjustable delay lines 112D and 124D, and the reference voltage generator 130, and more particularly, monitor the output data of the receiving circuit 120 and change at least a portion of the control parameters (as illustrated by a control path and a monitor path shown in FIG. 1), for controlling the memory interface circuit 100 to perform the self-calibration. As a result, the memory interface circuit 100 can achieve optimized performance in the general mode.

In this embodiment, the memory interface circuit 100 includes a plurality of terminals (e.g. a set of terminals corresponding to a channel) for transmitting or receiving the data signals DQ[7:0] and the data strobe signals DQS and DQS_N. As shown in the upper right corner of FIG. 1, the set of terminals can be represented by terminal symbols with the names of these signals, wherein the data signals DQ[7:0] include 8 bits [7:0] such as bit 7 to bit 0, and the data strobe signals DQS and DQS_N may be inverse signals of each other and/or may be a set of differential signals, but the present invention is not limited thereto. In some embodiments, a channel number Y may be a positive integer, and the plurality of terminals may include Y sets of terminals corresponding to T channels for transmitting or receiving data signals {DQ[((8*Y)−1):(8*(Y−1))], ..., DQ[7:0]} and data strobe signals {{DQS[(Y−1)], DQS_N[(Y−1)]}, ..., {DQS[0], DQS_N[0]}}. The memory interface circuit 100 may include a plurality of data input and output terminals {PAD(x)}, such as at least one set of data input and output terminals {PAD(x)} corresponding to at least one channel, for coupling the DDR SDRAM 10 to the transmitting circuit 110 and the receiving circuit 120. When Y=1, the plurality of data input and output terminals {PAD(x)} may include a set of data input and output terminals {PAD(8), ..., PAD(1)} corresponding to a channel, for transmitting or receiving data signals DQ[7:0] corresponding to the channel. When Y>1, the plurality of data input and output terminals {PAD(x)} may include Y sets of data input and output terminals {{PAD(8*Y), ..., PAD((8*(Y−1))+1)}, ..., {PAD(8), ..., PAD(1)}} corresponding to Y channels, for transmitting or receiving data signals {DQ[((8*Y)−1):(8*(Y−1))], ..., DQ[7:0]}.

In some embodiments, the memory interface circuit 100 may have multiple self-calibration functions (e.g. an offset calibration function and a data eye width optimization function).

Figure 2:
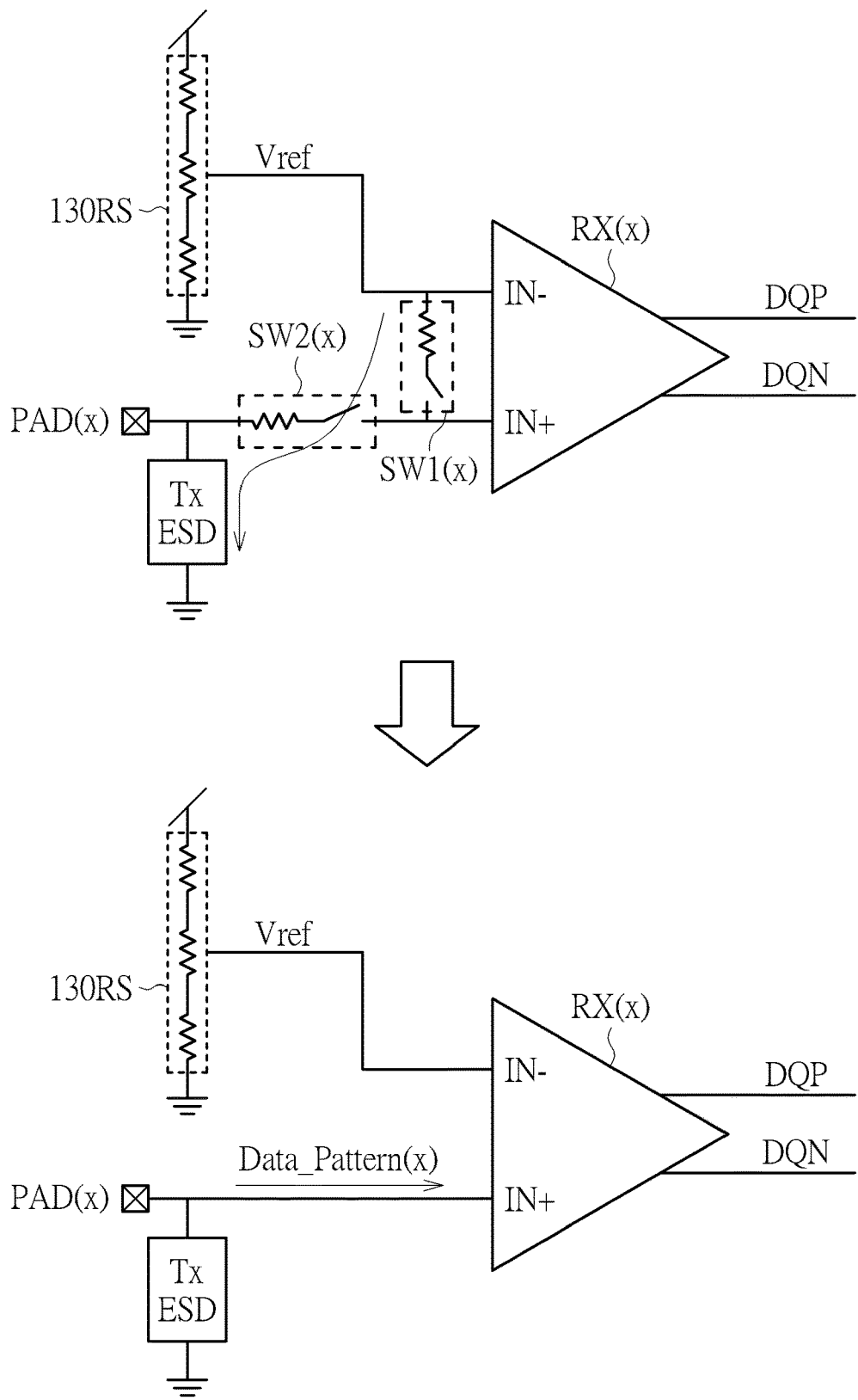
FIG. 2 illustrates a non-additional-switch-based calibration control scheme of a method for performing self-calibration of receiver offset without shorting differential input terminals of a receiver and an additional-switch-based calibration control scheme.

FIG. 2 illustrates, in the lower half thereof, a non-additional-switch-based calibration control scheme of a method for performing self-calibration of receiver offset without shorting differential input terminals of a receiver, wherein an additional-switch-based calibration control scheme is illustrated in the upper half of FIG. 2 for better comprehension, but the present invention is not limited thereto. The method may be applicable to the apparatus shown in FIG. 1, and more particularly, may be applicable to the memory interface circuit 100. The set of different input terminals of any receiver RX(x) includes a positive input terminal and a negative input terminal (e.g. input terminals IN+ and IN−, wherein the positive input terminal is coupled to the data input and output terminal PAD(x), and the negative input terminal is coupled to reference voltage generator 130. The reference voltage generator 130 may include a voltage setting circuit 130RX (which may include a set of resistors in series) for outputting a divided voltage as the reference voltage Vref, but the present invention is not limited thereto. In some embodiments, architecture of the reference voltage generator 130 may vary. In addition, a set of differential output terminals of the receiver RX(x) includes a positive output terminal and a negative output terminal (e.g. output terminals DQP and DQN), and the set of differential output terminals are coupled to the DFE 122. The receiver RX(x) includes a comparator (not shown in FIG. 1) and utilizes the comparator to compare an input signal received by the input terminal IN+ with an input signal received by an input terminal IN− to generate at least one comparison result, and generates differential output signals carrying the at least one comparison result for outputting to the DFE 122 through the output terminals DQP and DQN, wherein two input terminals of the comparator are coupled to the input terminals IN+ and IN−, respectively. In addition, an output terminal of the transmitter TX(x), together with an electrostatic discharge (ESD) protection circuit (for brevity, labeled as "Tx ESD" in FIG. 2) of the transmitter TX(x) are coupled to the data input and output terminal PAD(x).

As shown in the upper half of FIG. 2, according to the additional-switch-based calibration control scheme, a switch SW1(x) is required to be coupled between the input terminals IN+ and IN− of the receiver RX(x) for temporarily shorting the input terminals IN+ and IN−, and a switch SW2(x) is required to be coupled between the input terminal IN+ and the data input and output terminal PAD(x) for temporarily disconnecting a signal path between the terminals PAD(x) and IN+. The switches SW1(x) and SW2(x) are typically not ideal due to limitations of component characteristics. Under this condition, implementing the switches SW1(x) and SW2(x) in this architecture may bring some side effects. For example, in order to reduce a certain side effect (e.g. a bandwidth of the signal path between the data input and output terminal PAD(x) and the input terminal IN+ is narrowed), an on resistance of the switch SW2(x) is required to be reduced, which may cause an off resistance of the switch SW2(x) to become smaller. In order to reduce another side effect (e.g. a leakage path provided by the switch SW2(x) making the adjustment operation of the reference voltage Vref less accurate), the off resistance of the switch SW2(x) should be increased. Reducing the on-resistance and increasing the off-resistance may correspond to different designs of the switch SW2(x), respectively. Thus, there may be tradeoffs between different side effects.

As shown in the lower half of FIG. 2, according to the non-additional-switch-based calibration control scheme, there is no need to set switches SW1(x) and SW2(x). Under the control of the training control circuit 100T, the memory interface circuit 100 may utilize the corresponding transmitter TX(x) to generate at least one input signal carrying at least one data pattern Data_Pattern(x) for inputting to the input terminal IN+. More particularly, the training control circuit 100T may monitor the output data of the receiving circuit 120 and change at least a portion of control parameters (as illustrated by the control path and the monitor path shown in FIG. 1) for completing the self-calibration.

Figure 3:
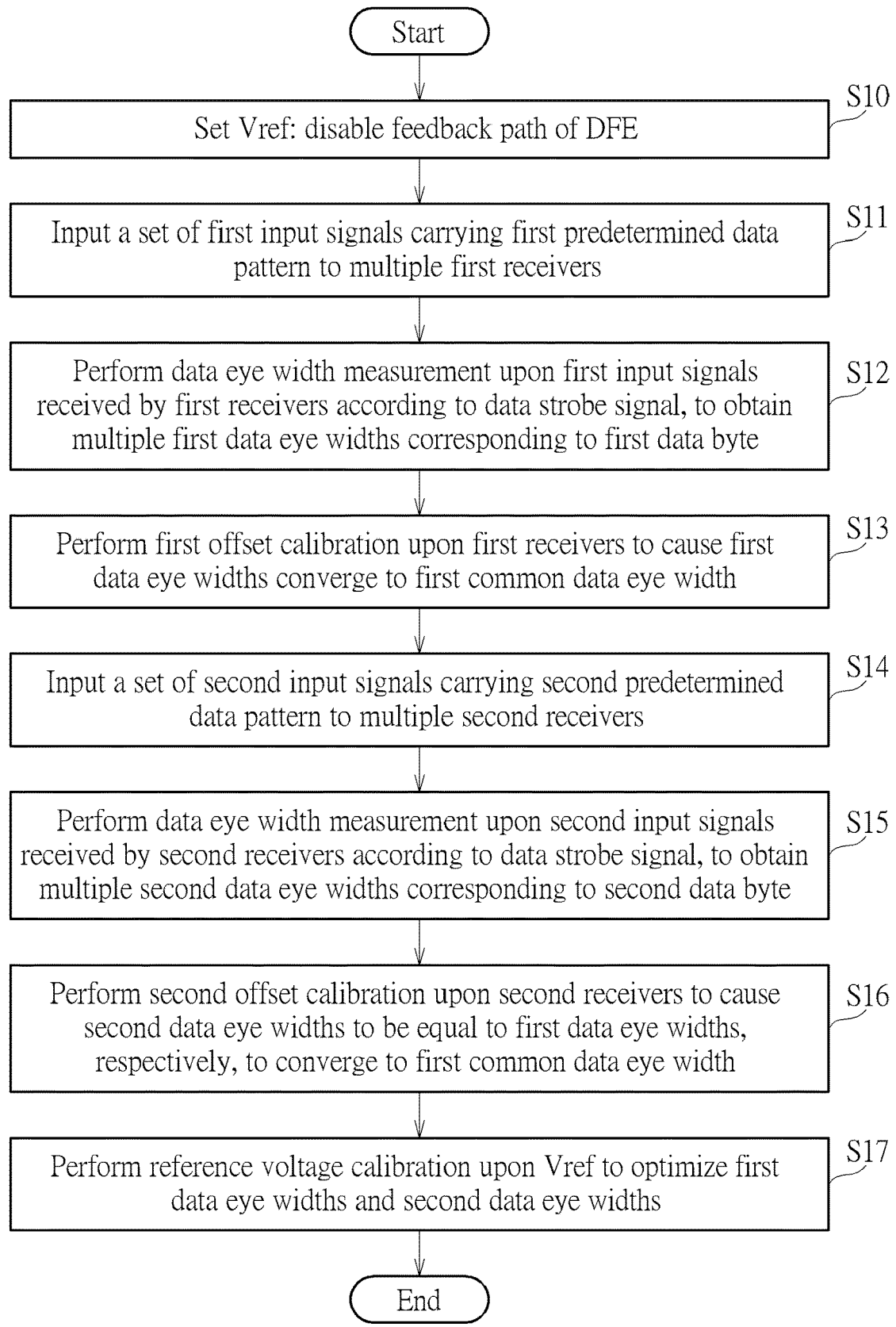
FIG. 3 is a diagram illustrating a flow chart of the method according to an embodiment of the present invention.

FIG. 3 is a diagram illustrating a flow chart of the method according to an embodiment of the present invention, wherein the method may be applicable to the memory interface circuit 100. The method may include utilizing the training control circuit 100T to control the memory interface circuit 100 in the calibration mode for performing the self-calibration, wherein the self-calibration may include operations of Steps S10-S17, and the training control circuit 100T may utilize the controller 101 to perform the operations of Steps S10-S17, but the present invention is not limited thereto. In some embodiments, the training control circuit 100T may be integrated into the controller 101. In addition, the receivers 121 (e.g. the receivers {RX(x)}) may include multiple receivers {RX_E(x)} on even data paths and multiple receivers {RX_O(x)} on odd data paths, and the above-mentioned any receiver RX(x) may represent one of the receiver RX_E(x) and the receiver RX_O(x). The receiver RX_E(x) may configure offset of comparators therein according to an offset control code Offset_code_E(x). The receiver RX_O(x) may configure offset of comparators therein according to an offset control code Offset_code_O(x). The training control circuit 100T may adjust respective offset control codes {Offset_code_E(x)} of the receivers {RX_E(x)} and respective offset control codes {Offset_code_O(x)} of the receivers {RX_O(x)}, and adjust the reference voltage Vref to complete the self-calibration.

In Step S10, the memory interface circuit 100 may set up the reference voltage Vref, and more particularly, control the reference voltage generator 130 to select one of multiple candidate voltage values (e.g. a predetermined candidate voltage value) as the reference voltage Vref, and disable multiple feedback paths of the DFE 122.

In Step S11, the memory interface circuit 100 may input a set of first input signals carrying at least one first predetermined data pattern (e.g. at least one first bit sequence) to multiple first receivers (e.g. the receivers {RX_E(x)}) in the receivers 121 (e.g. the receivers {RX(x)}). For example, the multiple first receivers (e.g. the receivers {RX_E(x)}) may be coupled to the at least one set of data input and output terminals {PAD(x)}.

In Step S12, the memory interface circuit 100 may perform data eye width measurement upon the set of first input signals received by the multiple first receivers (e.g. the receivers {RX_E(x)}) according to at least one data strobe signal (e.g. the data strobe signals DQS and DQS_N), to obtain multiple first data eye widths corresponding to a first data byte (e.g. respective widths of multiple first data eyes), wherein any of the multiple first data eye widths may correspond to a first data bit in multiple first data bits belonging to the first data byte.

In Step S13, the memory interface circuit 100 may perform a first offset calibration upon the multiple first receivers (e.g. the receivers {RX_E(x)}) to make the multiple first data eye widths converge to a first common data eye width, wherein the first offset calibration may include adjusting respective offset control codes of the multiple first receivers (e.g. the offset control codes {Offset_code_E(x)}).

In Step S14, the memory interface circuit 100 may input a set of second input signals carrying at least one second predetermined data pattern (e.g. at least one second bit sequence) to multiple second receivers (e.g. the receivers {RX_O(x)}) in the receivers 121 (e.g. the receivers {RX(x)}). For example, the multiple second receivers (e.g. the receivers {RX_O(x)}) may be coupled to the at least one set of data input and output terminals {PAD(x)}.

In Step S15, the memory interface circuit 100 may perform the data eye width measurement upon the set of second input signals received by the multiple second receivers (e.g. the receivers {RX_O(x)}) according to the at least one data strobe signal (e.g. the data strobe signals DQS and DQS_N), to obtain multiple second data eye widths corresponding to a second data byte (e.g. respective widths of multiple second data eyes), wherein any of the multiple second data eye widths may correspond to a second data bit in multiple second data bits belonging to the second data byte.

In Step S16, the memory interface circuit 100 may perform a second offset calibration upon the multiple second receivers (e.g. the receivers {RX_O(x)}) to make the multiple second data eye widths be equal to the multiple first data eye widths, respectively, so that the multiple second data eye widths converge to the first common data eye width, wherein the second offset calibration may include adjusting respective offset control codes of the multiple second receivers (e.g. the offset control codes {Offset_code_O(x)}).

In Step S17, the memory interface circuit 100 may perform reference voltage calibration upon the reference voltage Vref of the receivers 121 (e.g. the receivers {RX(x)}) to optimize the multiple first data eye widths and the multiple second data eye widths, and more particularly, may control the reference voltage generator 130 to select a candidate voltage value from the multiple candidate voltage values as a target voltage value of reference voltage Vref, to maximize the multiple first data eye widths and the multiple second data eye widths. For example, the optimization of the multiple first data eye widths and the multiple second data eye widths causes a target common data eye width to which the multiple first data eye widths and the multiple second data eye widths both converge to change from the first command data eye width to a second common data eye width greater than the first command data eye width.

In any of the Steps S12 and S15, the operations of the data eye width measurement may include:

(1) the memory interface circuit 100 may delay the at least one data strobe signal (e.g. the data strobe signals DQS and DQS_N) by different delay amounts, respectively, and more particularly, may perform delay adjustment upon the at least one data strobe signal according to multiple predetermined delay amounts, to make the at least one data strobe signal sweep from an endpoint of a delay range to another endpoint of the delay range, wherein the multiple predetermined delay amounts may correspond to various configurations of multiple delay units within any of the adjustable delay lines 112D and 114D (e.g. enable or disable multiple configurations of different numbers of delay units), and the delay range may represent an interval including the multiple determined delay amounts (e.g. the endpoints of the delay range may represent the minimum value and the maximum value of the multiple predetermined delay amounts); and (2) the memory interface circuit 100 may monitor output data of the receiving circuit 120 to find out a first transition time and a second transition time of any bit in a set of bits belonging to a byte in the output data with respect to the delay range, to determine a data eye width corresponding to the any bit, wherein a difference value between the first transition time and the second transition time may indicate the data eye width of the any bit;

Wherein the delay adjustment may be implemented by the adjustable delay line 112D in the transmitting circuit 110 and/or the adjustable delay lines 124D in the receiving circuit 120.

For better comprehension, the method may be illustrated with the working flow shown in FIG. 3, but the present invention is not limited thereto. According to some embodiments, one or more steps may be added, deleted, or changed in the working flow shown in FIG. 3. For example, a first partial working flow including Steps S11-S13 may be implemented as a first loop for performing operations of Steps S11-S13 multiple times, so that the multiple first data eye widths converge to the first common data eye width. In addition, a second partial working flow including Steps S14-S16 may be implemented as a second loop for performing operations of Steps S14-S16 multiple times, so that the multiple second data eye widths are equal to the multiple first data eye widths, respectively, and converge to the first common data eye width. For brevity, similar descriptions for this embodiment are not repeated in detail here.

In some embodiments, the multiple first receivers may receive a set of first bits at a first time point, and the multiple second receivers may receive a set of second bits at a second time point. The set of first bits may represent even bits, and the set of second bits may represent odd bits, wherein the multiple first receivers may represent even bit receivers (e.g. the receivers {RX_E(x)}), and the multiple second receivers may represent odd bit receivers (e.g. the receivers {RX_O (x)}), but the present invention is not limited thereto. In some examples, the set of first bits may represent odd bits, and the set of second bits may represent even bits, wherein the multiple first receivers may represent odd bit receivers (e.g. the receivers {RX_O(x)}) and the multiple second receivers may represent even bit receivers (e.g. the receivers {RX_E(x)}). For brevity, similar descriptions for this embodiment are not repeated in detail here.

Figure 4:
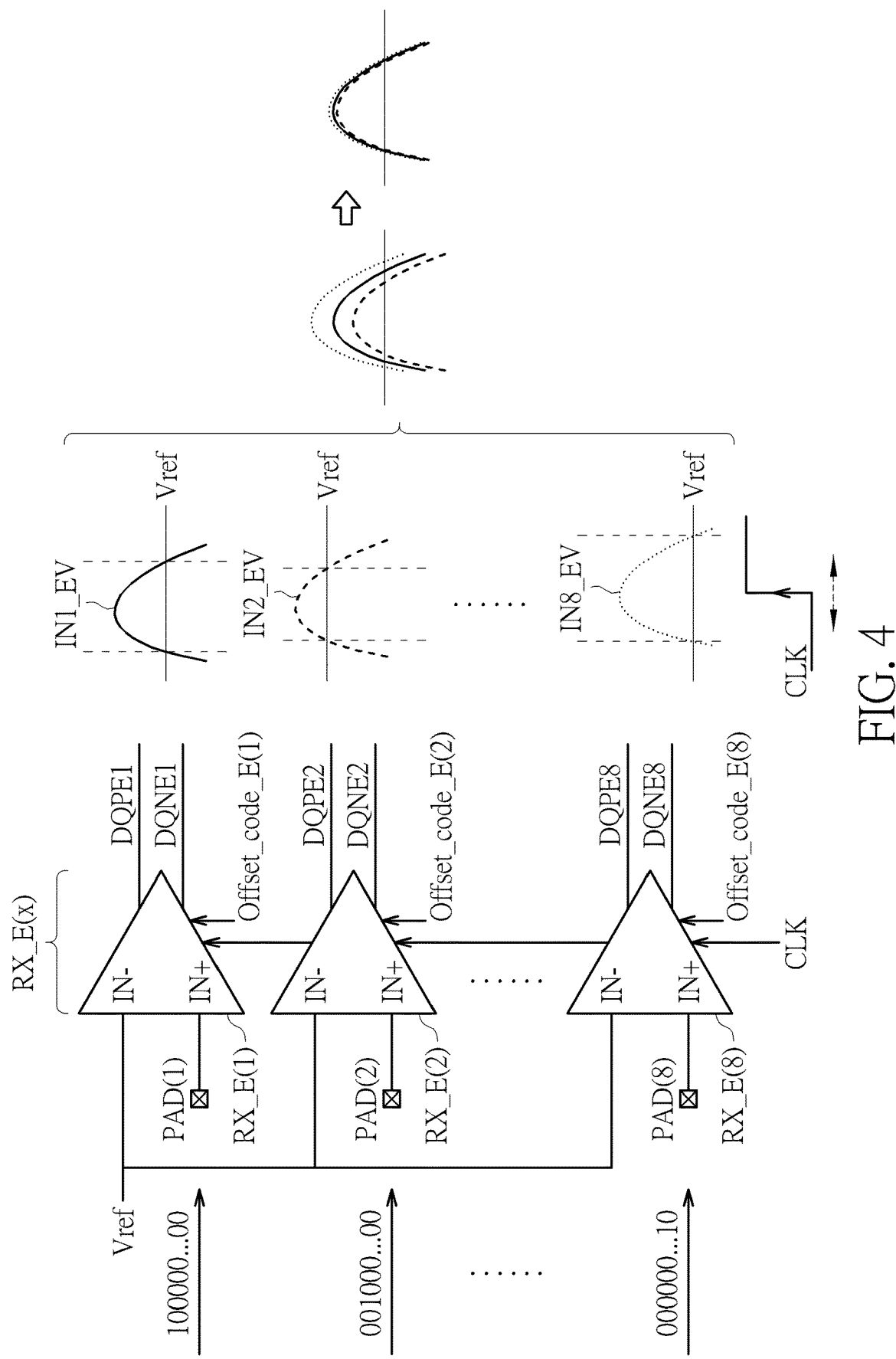
FIG. 4 is a diagram illustrating an offset calibration control scheme of the method according to an embodiment of the present invention.

FIG. 4 is a diagram illustrating an offset calibration control scheme of the method according to an embodiment of the present invention. For example, in Step S11, the multiple first receivers (e.g. the receivers {RX_E(x)}) may include receivers {RX_E(1), RX_E(2), ..., RX_E(8)}, the at least one first predetermined data pattern may include patterns of multiple first bit sequences {1000000000000000}, {0010000000000000}, ... and {0000000000000010} (for brevity, labeled as "100000_00", "001000_00", and "000000_10", respectively, in FIG. 4), and the set of first input signals may include input signals {IN1_EV, IN2_EV, ..., IN8_EV} received from the transmitting circuit 110 (e.g. corresponding transmitters {TX(x)}, such as transmitters {TX(1), TX(2), ..., TX(8)}) by the receivers {RX_E(1), RX_E(2), ..., RX_E(8)}, wherein the input signals {IN1_EV, IN2_EV, ..., IN8_EV} may be input to input terminals {IN+} of the receivers {RX_E(1), RX_E(2), ..., RX_E(8)}, respectively, and waveforms of the input signals {IN1_EV, IN2_EV, ..., IN8_EV} may correspond to the first bit sequences {1000000000000000}, {0010000000000000}, ... and {0000000000000010}, respectively. The receivers {RX_E (1), RX_E(2), ..., RX_E(8)} may receive the input signals {IN1_EV, IN2_EV, ..., IN8_EV} according to a clock signal CLK, respectively. The DFE 122 may be coupled to respective different output terminals of the receivers {RX_E (1), RX_E(2), ..., RX_E(8)}, such as output terminals {{DQPE1, DQNE1}, {DQPE2, DQNE2}, ..., {DQPE8, DQNE8}}, and more particularly, may receive corresponding data signals from the receivers {RX_E(1), RX_E(2), ..., RX_E(8)} and process the data signals to generate data on the even data paths. In Step S12, the multiple first data eye widths may include respective data eye widths of the input signals {IN1_EV, IN2_EV, ..., IN8_EV}, such as respective widths of respective data eyes of the input signals {IN1_EV, IN2_EV, ..., IN8_EV}. The input signals {IN1_EV, IN2_EV, ..., IN8_EV} shown in the center part of FIG. 4 and vertical dashed lines indicate the time points when these signals cross the reference voltage Vref, and the data eye width measurement operations in Step S12 may include:

(1) the memory interface circuit 100 may measure a time difference between two time points when the input signal IN1_EV crosses the reference voltage Vref, to act as a data eye width of the input signal IN1_EV;

(2) the memory interface circuit 100 may measure a time difference between two time points when the input signal IN2_EV crosses the reference voltage Vref, to act as a data eye width of the input signal IN2_EV;

and so on. For example:

(3) the memory interface circuit 100 may measure a time difference between two time points when the input signal IN8_EV crosses the reference voltage Vref, to act as a data eye width of the input signal IN8_EV;

wherein the data eye widths of the input signals {IN1_EV, IN2_EV, ..., IN8_EV} may correspond to 8 first data bits of a whole first data byte, respectively. In Step S13, the memory interface circuit 100 may adjust respective offset control codes {Offset_code_E(1), Offset_code_E (2), ..., Offset_code_E(8)} of the receivers {RX_E(1), RX_E(2), ..., RX_E(8)} to cause respective data eye widths of the input signals {IN1_EV, IN2_EV, ..., IN8_EV} to converge to the first common data eye width (as shown in the rightmost part of FIG. 4). As a result, the data signals DQ[7:0] corresponding to the same channel on the even data paths, such as the input signals {IN1_EV, IN2_EV, ..., IN8_EV}, may have similar or identical eye margins. For brevity, similar descriptions for this embodiment are not repeated in detail here.

In this embodiment, the patterns of the first bit sequences {1000000000000000}, {0010000000000000}, ... and {0000000000000010} may be examples of the at least one first predetermined data pattern, but the present invention is not limited thereto. In some embodiments, the least one first predetermined data pattern may vary. For brevity, similar descriptions for these embodiments are not repeated in detail here.

Figure 5:
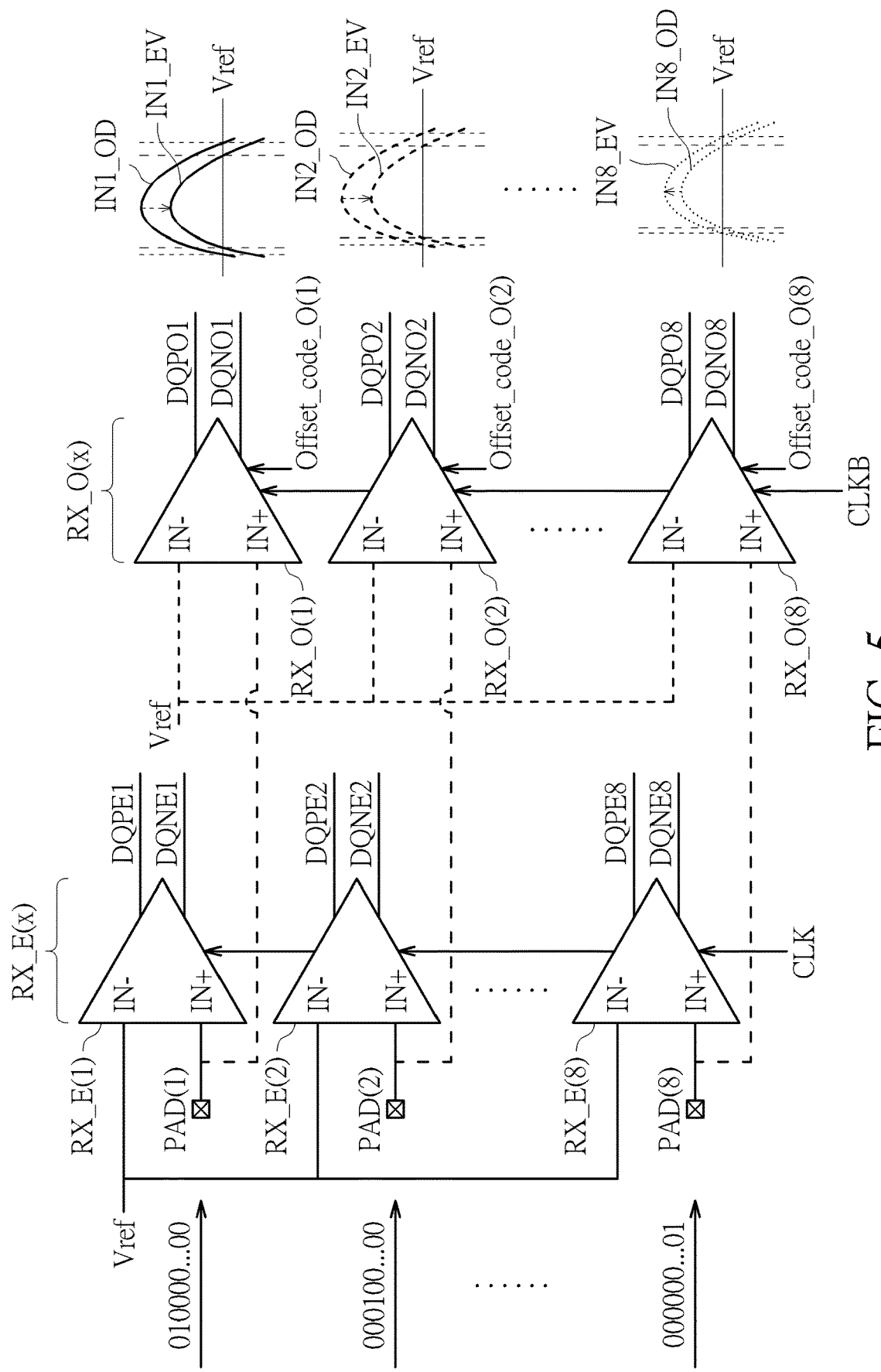
FIG. 5 is a diagram illustrating implementation details of the offset calibration control scheme shown in FIG. 4 according to an embodiment of the present invention.

FIG. 5 is a diagram illustrating some implementation details of the offset calibration control scheme shown in FIG. 4 according to an embodiment of the present invention. For example, in Step S14, the second receivers (e.g. the receivers {RX_O(x)}) may include receivers {RX_O(1), RX_O(2), ..., RX_O(8)}, the at least one second predetermined data pattern may include patterns of second bit sequences {0100000000000000}, {0001000000000000}, . . . and {0000000000000001} (for brevity, labeled as "010000 . . . 00", "000100 . . . 00", and "000000 . . . 01", respectively, in FIG. 5), and the set of second input signals may include input signals {IN1_OD, IN2_OD, . . . , IN8_OD} received from the transmitting circuit 110 (e.g. corresponding transmitters {TX(x)}, such as transmitters {TX(1), TX(2), . . . , TX(8)}) by the receivers {RX_O(1), RX_O(2), . . . , RX_O(8)}, wherein the input signals {IN1_OD, IN2_OD, . . . , IN8_OD} may be input to input terminals {IN+} of the receivers {RX_O(1), RX_O(2), . . . , RX_O(8)}, respectively, and waveforms of the input signals {IN1_OD, IN2_OD, . . . , IN8_OD} may correspond to the second bit sequences {0100000000000000}, {0001000000000000}, . . . and {0000000000000001}, respectively. The receivers {RX_O(1), RX_O(2), . . . , RX_O(8)} may receive the input signals {IN1_OD, IN2_OD, . . . , IN8_OD} according to a clock signal CLKB, respectively. The DFE 122 may be coupled to respective different output terminals of the receivers {RX_O(1), RX_O(2), . . . , RX_O(8)}, such as output terminals {{DQPO1, DQNO1}, {DQPO2, DQNO2}, . . . , {DQPO8, DQNO8}}, and more particularly, may receive corresponding data signals from the receivers {RX_O(1), RX_O(2), . . . , RX_O(8)} and process the data signals to generate data on the odd data paths. In Step S15, the multiple second data eye widths may include respective data eye widths of the input signals {IN1_OD, IN2_OD, . . . , IN8_OD}, such as respective widths of respective data eyes of the input signals {IN1_OD, IN2_OD, . . . , IN8_OD}. The input signals {IN1_OD, IN2_OD, . . . , IN8_OD} shown in the rightmost part of FIG. 5 and vertical dashed lines indicate the time points when these signals cross the reference voltage Vref, and the data eye width measurement operations in Step S15 may include:

(1) the memory interface circuit 100 may measure a time difference between two time points when the input signal IN1_OD crosses the reference voltage Vref, to act as a data eye width of the input signal IN1_OD;

(2) the memory interface circuit 100 may measure a time difference between two time points when the input signal IN2_OD crosses the reference voltage Vref, to act as a data eye width of the input signal IN2_OD; and so on. For example:

(3) the memory interface circuit 100 may measure a time difference between two time points when the input signal IN8_OD crosses the reference voltage Vref, to act as a data eye width of the input signal IN8_OD;

wherein the data eye widths of the input signals {IN1_OD, IN2_OD, . . . , IN8_OD} may correspond to 8 second data bits of a whole second data byte, respectively. In Step S16, the memory interface circuit 100 may adjust respective offset control codes {Offset_code_O(1), Offset_code_O(2), . . . , Offset_code_O(8)} of the receivers {RX_O(1), RX_O(2), . . . , RX_O(8)} to cause respective data eye widths of the input signals {IN1_OD, IN2_OD, . . . , IN8_OD} to be equal to the respective data eye widths of the input signals {IN1_EV, IN2_EV, . . . , IN8_EV}, respectively, so they converge to the first common data eye width (as shown in the rightmost part of FIG. 5). As a result, the data signals DQ[7:0] corresponding to the same channel on the even data paths (e.g. the input signals {IN1_EV, IN2_EV, . . . , IN8_EV}) and the data signals DQ[7:0] corresponding to the same channel on the odd data paths (e.g. the input signals {IN1_OD, IN2_OD, . . . , IN8_OD}) may have similar or identical eye margins. For brevity, similar descriptions for this embodiment are not repeated in detail here.

In this embodiment, the patterns of the second bit sequences {0100000000000000}, {0001000000000000}, . . . and {0000000000000001} may be examples of the at least one second predetermined data pattern, but the present invention is not limited thereto. In some embodiments, the least one second predetermined data pattern may vary. For brevity, similar descriptions for these embodiments are not repeated in detail here.

Figure 6:
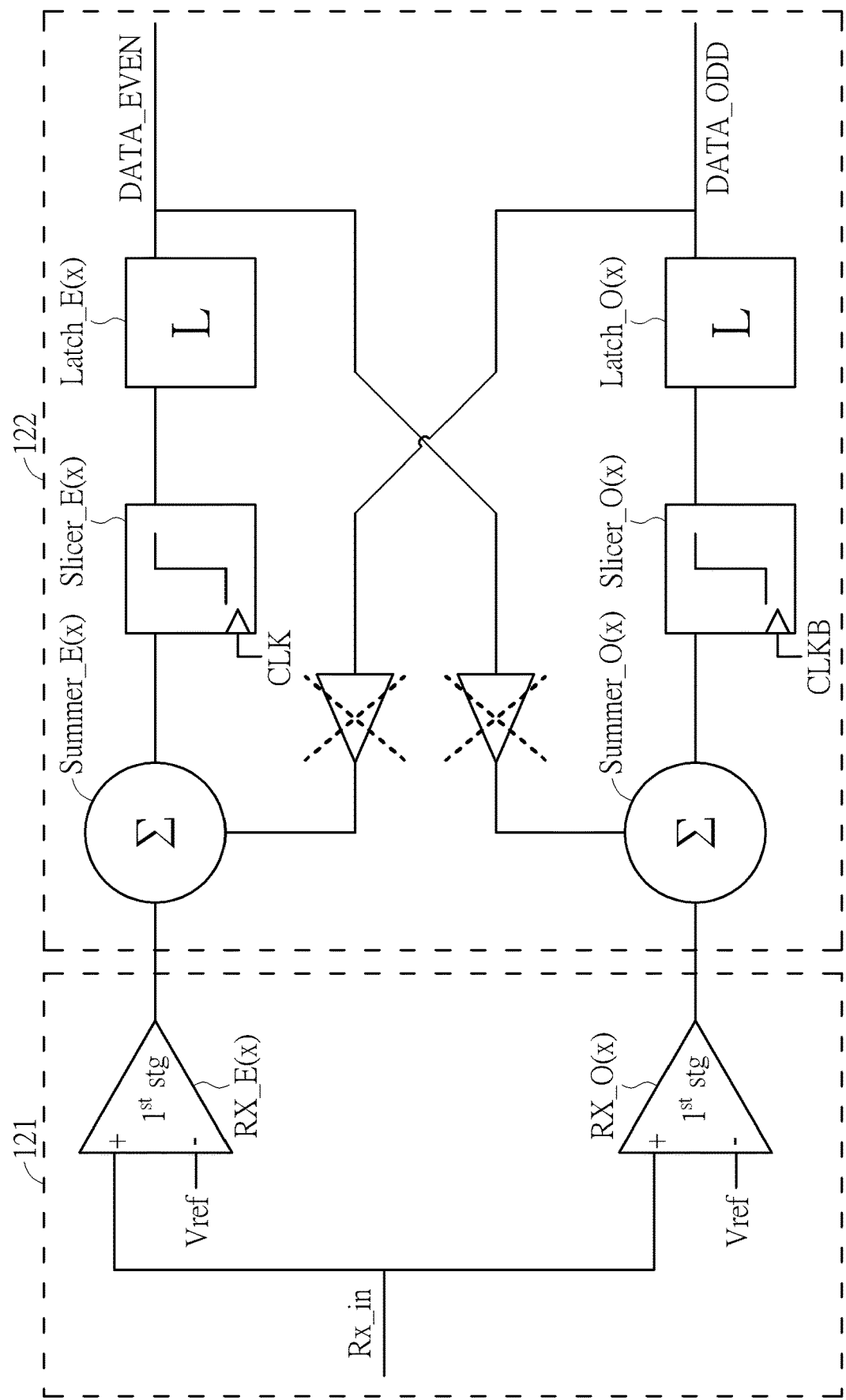
FIG. 6 is a diagram illustrating implementation details of a receiving circuit shown in FIG. 1 according to an embodiment of the present invention, wherein some signal processing paths of the receiving circuit are temporarily disabled in the offset calibration control scheme shown in FIG. 4.

FIG. 6 is a diagram illustrating some implementation details of the receiving circuit 120 shown in FIG. 1 according to an embodiment of the present invention, wherein some signal processing paths of the receiving circuit 120 are temporarily disabled in the offset calibration control scheme shown in FIG. 4. For example, the receivers RX_E(x) and RX_O(x) arranged to receive at least one input signal Rx_in may belong to a first stage circuit in the architecture shown in FIG. 6 (labeled as "1$^{st}$ stg" for brevity), and the at least one input signal Rx_in may include a data signal DQ[x] corresponding to a bit x in the data signals DQ[7:0] (e.g. an input signal IN(x+1)_EV corresponding to the bit x in the input signals {IN1_EV, IN2_EV, . . . , IN8_EV} and/or an input signal IN(x+1)_OD corresponding to the bit x in the input signals {IN1_OD, IN2_OD, . . . , IN8_OD}). The DFE 122 may include summer circuits Summer_E(x) and Summer_O(x) (labeled as "Σ" for brevity), slicers Slicer_E(x) and Slicer_O(x), and latch circuits Latch_E(x) and Latch_O(x) (labeled as "L" for brevity). The summer circuit Summer_E(x), the slicer Slicer_E(x), and the latch circuit Latch_E (x) may be coupled to the receiver RX_E(x) for generating data DATA_EVEN as decision-feedback-equalized data on the even data path shown in the upper part of this architecture. The summer circuit Summer_O(x), the slicer Slicer_O(x), and the latch circuit Latch_O(x) may be coupled to the receiver RX_O(x) for generating data DATA_ODD as decision-feedback-equalized data on the odd data path shown in the lower part of this architecture.

In the general mode, the data DATA_EVEN and the data FATA_ODD may be fed back to the summer circuits Summer_O(x) and Summer_E(x) by the feedback paths mentioned in Step S10. In the calibration mode, the memory interface circuit 100 may temporarily disable the feedback paths of the DFE 122 (illustrated by two "X" shapes drawn with dotted lines for better comprehension) to ensure correctness of the self-calibration. For brevity, similar descriptions for this embodiment are not repeated in detail here.

Figure 7:
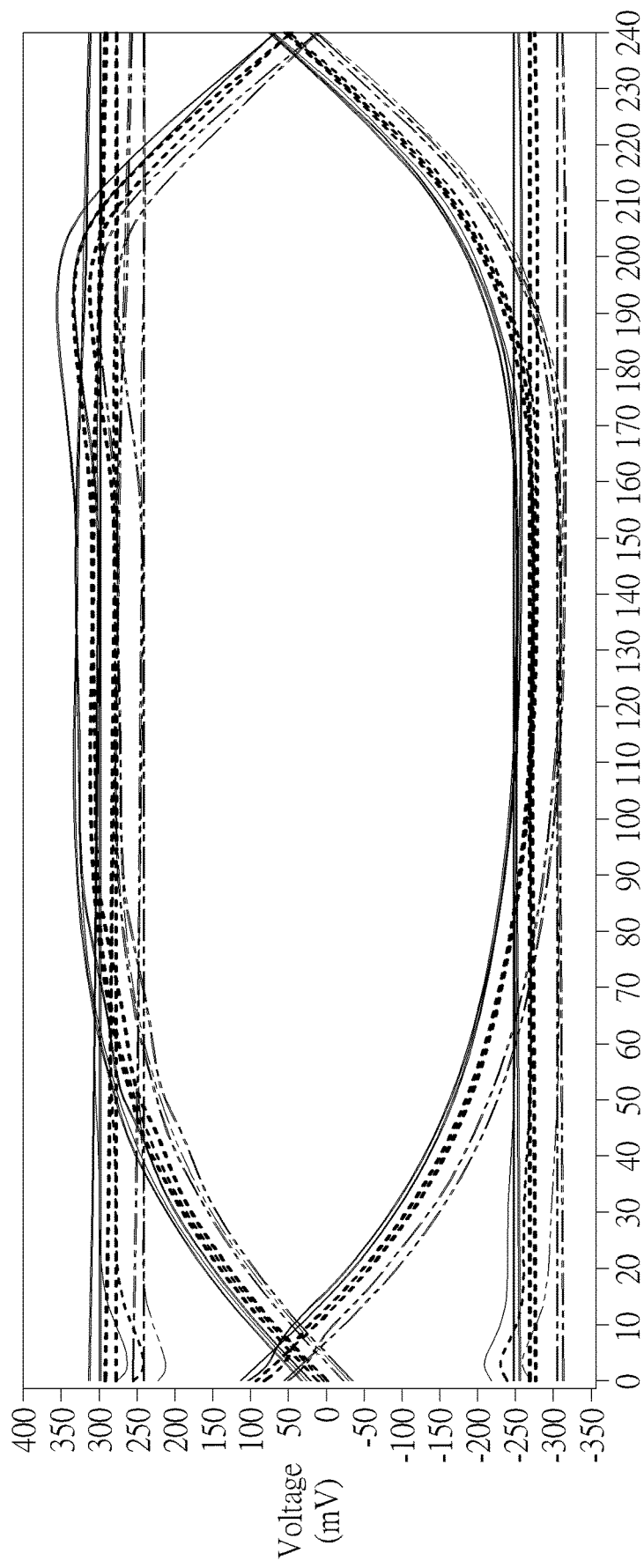
FIG. 7 is a diagram illustrating variation of summer outputs with respect to offset control codes according to an embodiment of the present invention.

FIG. 7 is a diagram illustrating variation of summer outputs with respect to offset control codes according to an embodiment of the present invention, wherein the horizontal axis may represent time measured in picoseconds (ps), and the vertical axis may represent voltage measured in millivolts (mV), but the invention is not limited thereto. In some embodiments, curves of related signals shown in FIG. 7 and/or related measurement units may vary.

When the offset control codes {{Offset_code_E(1), . . . , Offset_code_E(8)}, {Offset_code_O(1), . . . , Offset_code_O(8)}} are set as a first set of offset control codes (e.g. some candidate offset control codes), respectively, data eyes of respective output signals of the summer circuits Summer_E(x) and Summer_O(x) may have a greater offset (labeled as "Summer outputs corresponding to the first set of offset control codes" for brevity). When the offset control codes {{Offset_code_E(1), . . . , Offset_code_E(8)}, {Offset_code_O(1), . . . , Offset_code_O(8)}} are adjusted towards a certain offset adjustment direction (e.g. an offset increasing direction or an offset decreasing direction) to become a second set of offset control codes (e.g. some reselected offset control codes), the data eyes of the respective output signals of the summer circuits Summer_E(x) and Summer_O(x) may have a smaller offset (labeled as "Summer outputs corresponding to the second set of offset control codes" for brevity). When the offset control codes {{Offset_code_E(1), . . . , Offset_code_E(8)}, {Offset_code_O(1), . . . , Offset_code_O(8)}} are further adjusted towards the same offset adjustment direction to become a third set of offset control codes (e.g. some reselected offset control codes), the data eyes of the respective output signals of the summer circuits Summer_E(x) and Summer_O(x) may have a much smaller offset (labeled as "Summer outputs corresponding to the third set of offset control codes" for brevity). Similar descriptions for this embodiment are not repeated in detail here.

Figure 8:
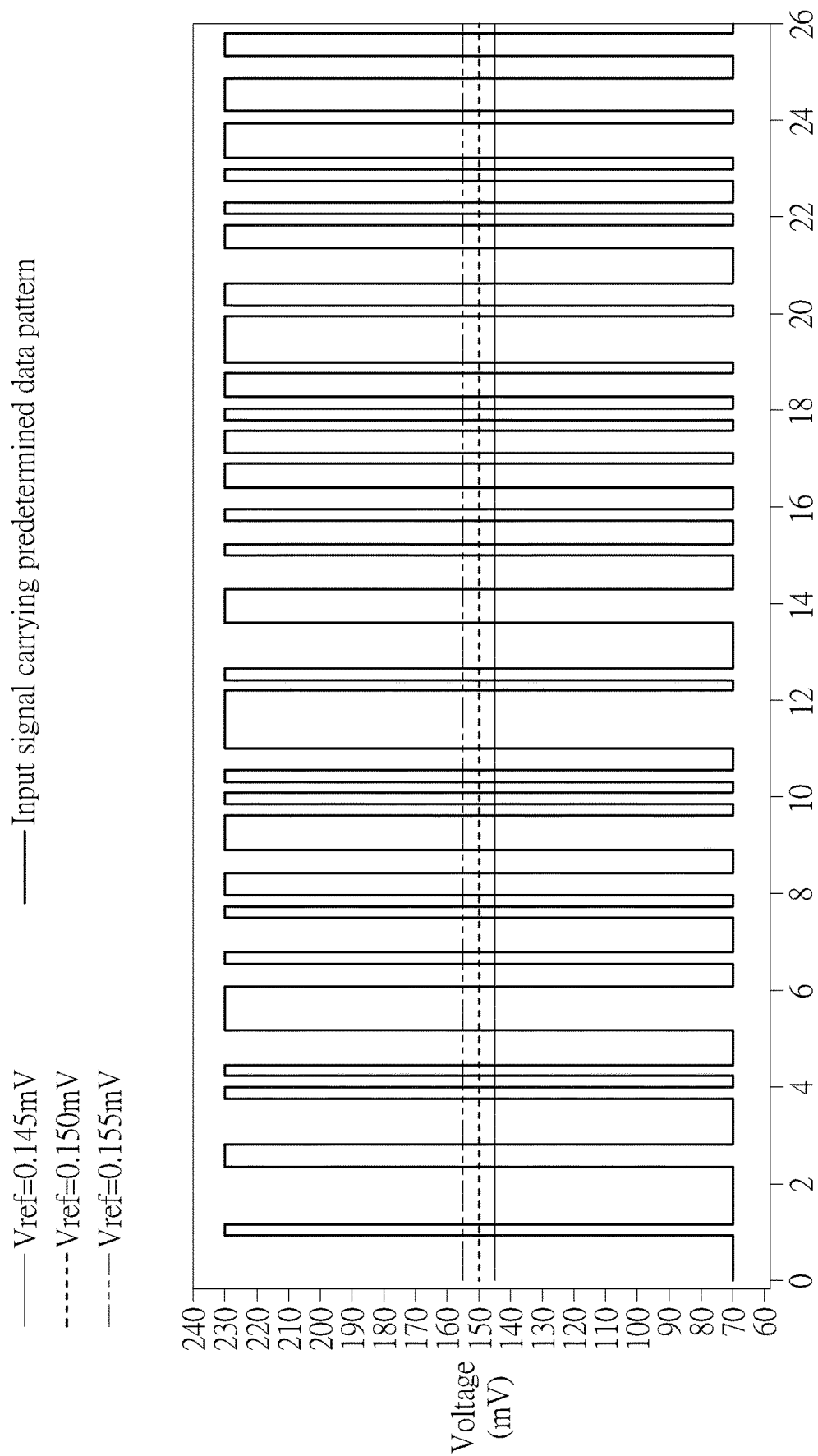
FIG. 8 is a diagram illustrating an adjustable reference voltage and an input signal carrying a predetermined data pattern according to an embodiment of the present invention.
Figure 9:
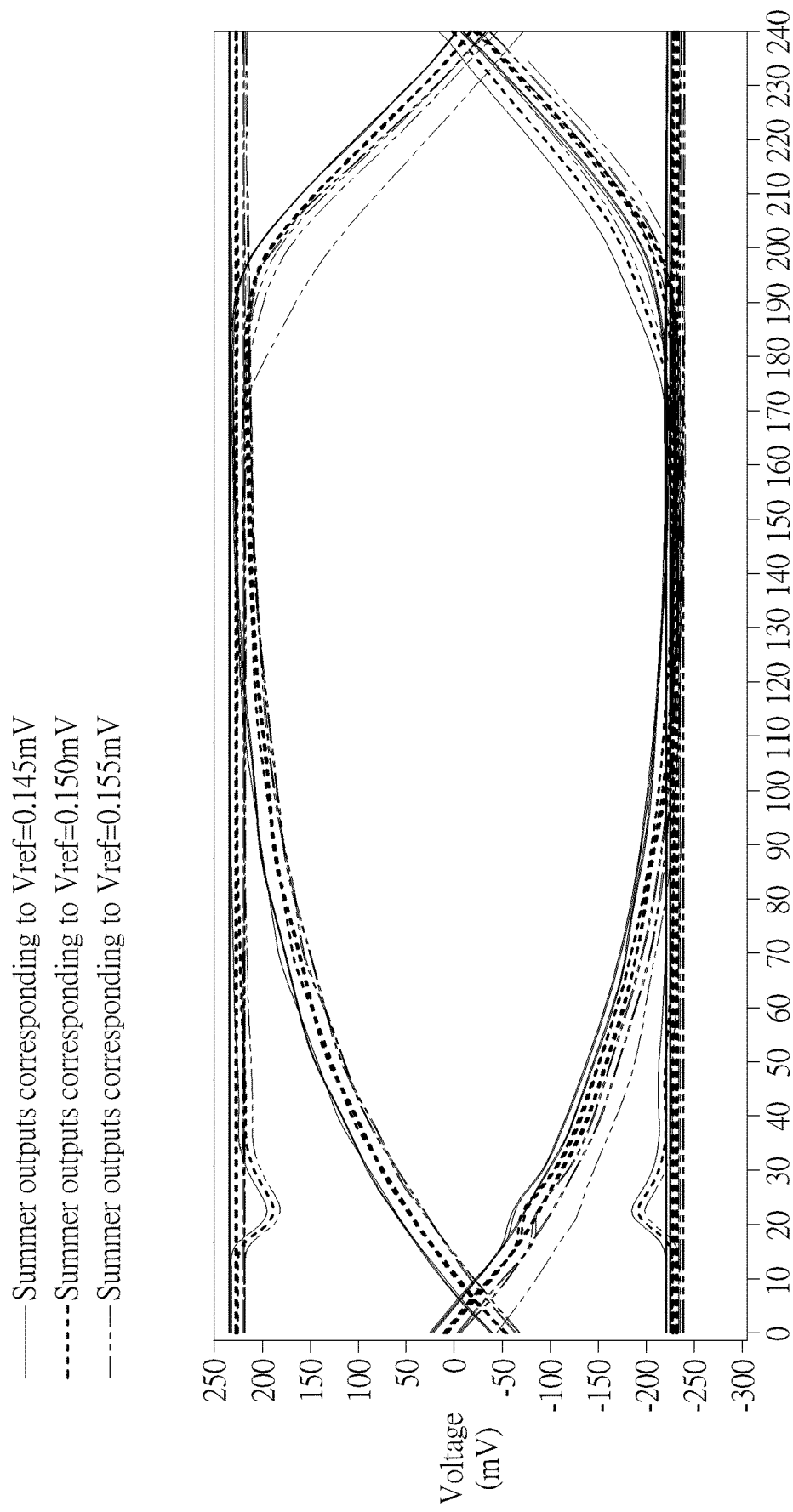
FIG. 9 is a diagram illustrating variation of summer outputs with respect to offset control codes according to the embodiment shown in FIG. 8.

FIG. 8 is a diagram illustrating an adjustable reference voltage and an input signal carrying a predetermined data pattern according to an embodiment of the present invention. FIG. 9 is a diagram illustrating variation of summer outputs with respect to offset control codes according to the embodiment shown in FIG. 8. The horizontal axis of FIG. 8 and FIG. 9 may represent time measured in nanoseconds (ns) and ps, respectively, and the vertical axis of FIG. 8 and FIG. 9 may represent voltage measured in mV, but the invention is not limited thereto. In some embodiments, curves of related signals shown in FIG. 8 and FIG. 9 and/or related measurement units may vary.

The reference voltage Vref may vary between some candidate voltage values. When Vref=0.145 mV, the data eyes of the respective output signals of the summer circuits Summer_E(x) and Summer_O(x) may have a greater offset (labeled as "Summer outputs corresponding to Vref=0.145 mV" for brevity). When Vref=0.150 mV, the data eyes of the respective output signals of the summer circuits Summer_E (x) and Summer_O(x) may have a smaller offset (labeled as "Summer outputs corresponding to Vref=0.150 mV" for brevity). When Vref=0.155 mV, the data eyes of the respective output signals of the summer circuits Summer_E(x) and Summer_O(x) may have a much smaller offset (labeled as "Summer outputs corresponding to Vref=0.155 mV" for brevity). Similar descriptions for this embodiment are not repeated in detail here.

In some embodiments, the apparatus may include at least one portion (e.g. a portion or all) of an electronic device, wherein the apparatus equipped with the DDR SDRAM 10 and the memory interface circuit 100 may be disposed in the electronic device. For example, the electronic device may be implemented by an electronic device 1000 shown in FIG. 10.

Figure 10:
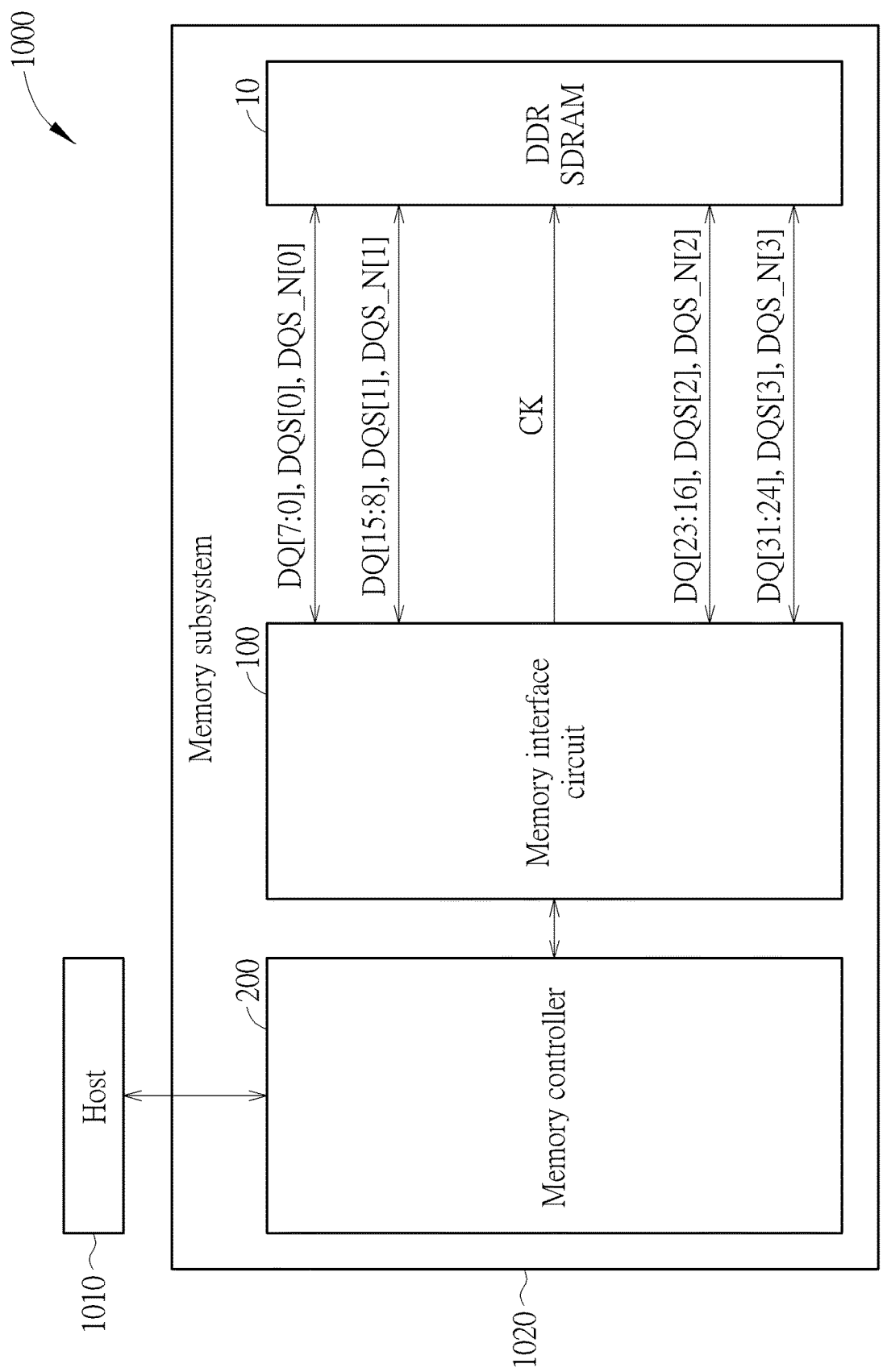
FIG. 10 is a diagram illustrating an apparatus for performing self-calibration of receiver offset without shorting differential input terminals of a receiver according to another embodiment of the present invention.

FIG. 10 is a diagram illustrating an apparatus for performing self-calibration of receiver offset without shorting differential input terminals of a receiver according to another embodiment of the present invention. The electronic device 1000 may include a host 1010 and a memory subsystem 1020, wherein the memory subsystem 1020 may include the DDR SDRAM 10, the memory interface circuit 100, and a memory controller 200, the host 1010 may be arranged to control the electronic device 1000, and the memory controller 200 may be arranged to control the memory subsystem 1020. Examples of the electronic device 1000 may include, but are not limited to: a desktop computer, a laptop computer, and a multifunctional mobile phone. In addition, the apparatus may include at least one component in the electronic device 1000 (e.g. the memory subsystem 1020), and more particularly, may include the entire electronic device 1000. In addition, the memory interface circuit 100 may generate at least one clock signal (e.g. a clock signal CK) for controlling the DDR SDRAM 10. When Y=4, the data signals {DQ[((8*Y)−1):(8*(Y−1))], . . . , DQ[7:0]} and the data strobe signals {{DQS[(Y−1)], DQS_N[(Y−1)]}, . . . , {DQS[0], DQS_N[0]}} may be implemented as data signals {DQ[31:24], DQ[23:16], DQ[15:8], DQ[7:0]} and data strobe signals{{DQS[3], DQS_N[3]}, {DQS[2], DQS_N[2]}, {DQS[1], DQS_N[1]}, {DQS[0], DQS_N[0]}}, respectively. For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing self-calibration of receiver offset without shorting differential input terminals of a receiver, comprising:
 a memory interface circuit, arranged to control a double data rate (DDR) synchronous dynamic random access memory (SDRAM), wherein a plurality of modes of the memory interface circuit comprise a general mode and a calibration mode, and the memory interface circuit comprises:
  a controller, arranged to control operations of the memory interface circuit;
  a transmitting circuit, coupled to the controller, and arranged to transmit data to the DDR SDRAM in the general mode;
  a receiving circuit, coupled to the controller, and arranged to receive data from the DDR SDRAM in the general mode, wherein the receiving circuit comprises a plurality of receivers, and the receiver represents any of the plurality of receivers; and
  a training control circuit, coupled to the controller, and arranged to control the memory interface circuit to perform the self-calibration in the calibration mode, wherein the self-calibration comprises:
   inputting a set of first input signals carrying at least one first predetermined data pattern to multiple first receivers in the plurality of receivers;
   performing data eye width measurement upon the set of first input signals received by the multiple first receivers according to at least one data strobe signal, to obtain multiple first data eye widths corresponding to a first data byte;
   performing first offset calibration upon the multiple first receivers to make the multiple first data eye widths converge to a first common data eye width, wherein the first offset calibration comprises adjusting respective offset control codes of the multiple first receivers;
   inputting a set of second input signals carrying at least one second predetermined data pattern to multiple second receivers in the plurality of receivers;
   performing the data eye width measurement upon the set of second input signals received by the multiple second receivers according to the at least one data strobe signal, to obtain multiple second data eye widths corresponding to a second data byte;
   performing second offset calibration upon the multiple second receivers to make the multiple second data eye widths be equal to the multiple first data eye widths, respectively, and converge to the first common data eye width, wherein the second offset calibration comprises adjusting respective offset control codes of the multiple second receivers; and
performing reference voltage calibration upon a reference voltage of the plurality of receivers to optimize the multiple first data eye widths and the multiple second data eye widths.

2. The apparatus of claim 1, wherein the memory interface circuit comprises at least one set of data input and output terminals corresponding to at least one channel, for coupling the DDR SDRAM to the transmitting circuit and the receiving circuit.

3. The apparatus of claim 2, wherein the multiple first receivers are coupled to the at least one set of data input and output terminals, and the multiple second receivers are coupled to the at least one set of data input and output terminals.

4. The apparatus of claim 1, wherein the multiple first receivers are arranged to receive a set of first bits at a first time point, and the multiple second receivers are arranged to receive a set of second bits at a second time point.

5. The apparatus of claim 4, wherein the set of first bits represents even bits, the set of second bits represents odd bits, the multiple first receivers represent even bit receivers, and the multiple second receivers represent odd bit receivers.

6. The apparatus of claim 4, wherein the set of first bits represents odd bits, the set of second bits represents even bits, the multiple first receivers represent odd bit receivers, and the multiple second receivers represent even bit receivers.

7. The apparatus of claim 1, wherein the data eye width measurement comprises:
performing delay adjustment upon the at least one data strobe signal according to multiple predetermined delay amounts, respectively, so that the at least one data strobe signal sweeps from an endpoint of a delay range to another endpoint of the delay range; and
monitoring output data of the receiving circuit to find out a first transition time and a second transition time of any bit in a set of bits belonging to a byte in the output data with respect to the delay range, to determine a data eye width corresponding to the any bit, wherein a difference value between the first transition time and the second transition time indicates the data eye width corresponding to the any bit.

8. The apparatus of claim 7, wherein the delay adjustment is implemented by an adjustable delay line in the transmitting circuit.

9. The apparatus of claim 7, wherein the delay adjustment is implemented by an adjustable delay line in the receiving circuit.

10. The apparatus of claim 1, wherein the reference voltage is generated by a reference voltage generator of the memory interface circuit; and the step of performing the reference voltage calibration upon the reference voltage of the plurality of receivers to optimize the multiple first data eye widths and the multiple second data eye widths further comprises:
controlling the reference voltage generator to select a candidate voltage value from multiple candidate voltage values as a target voltage value of the reference voltage, to maximize the multiple first data eye widths and the multiple second data eye widths.

11. The apparatus of claim 1, wherein optimization of the multiple first data eye widths and the multiple second data eye widths causes a target common data eye width to which the multiple first data eye widths and the multiple second data eye widths converge to change from the first common data eye width to a second common data eye width greater than the first common data eye width.

12. The apparatus of claim 1, wherein the apparatus comprises a memory subsystem, and the memory subsystem comprises:
a memory controller, arranged to control the memory subsystem;
the memory interface circuit; and
the DDR SDRAM.

13. The apparatus of claim 12, wherein the apparatus comprises an electronic device, and the electronic device comprises:
a host, arranged to control the electronic device; and
the memory subsystem.

14. A method for performing self-calibration of receiver offset without shorting differential input terminals of a receiver, wherein the method is applicable to a memory interface circuit, the memory interface circuit is arranged to control a double data rate (DDR) synchronous dynamic random access memory (SDRAM), and the method comprises:
utilizing a training control circuit to control the memory interface circuit to perform the self-calibration in a calibration mode, wherein a plurality of modes of the memory interface circuit comprise a general mode and the calibration mode, the memory interface circuit comprises a transmitting circuit, a receiving circuit, and the training control circuit, the transmitting circuit is arranged to transmit data to the DDR SDRAM in the general mode, the receiving circuit is arranged to receive data from the DDR SDRAM in the general mode, the receiver represents any of the plurality of receivers, and the self-calibration comprises:
inputting a set of first input signals carrying at least one first predetermined data pattern to multiple first receivers in the plurality of receivers;
performing data eye width measurement upon the set of first input signals received by the multiple first receivers according to at least one data strobe signal, to obtain multiple first data eye widths corresponding to a first data byte;
performing first offset calibration upon the multiple first receivers to make the multiple first data eye widths converge to a first common data eye width, wherein the first offset calibration comprises adjusting respective offset control codes of the multiple first receivers;
inputting a set of second input signals carrying at least one second predetermined data pattern to multiple second receivers in the plurality of receivers;
performing the data eye width measurement upon the set of second input signals received by the multiple second receivers according to the at least one data strobe signal, to obtain multiple second data eye widths corresponding to a second data byte;
performing second offset calibration upon the multiple second receivers to make the multiple second data eye widths be equal to the multiple first data eye widths, respectively, and converge to the first common data eye width, wherein the second offset calibration comprises adjusting respective offset control codes of the multiple second receivers; and
performing reference voltage calibration upon a reference voltage of the plurality of receivers to optimize the multiple first data eye widths and the multiple second data eye widths.

* * * * *